United States Patent [19]
Abdelgawad et al.

[11] Patent Number: 5,729,888
[45] Date of Patent: Mar. 24, 1998

[54] METHOD OF MAKING AN INTEGRATED ELECTRICAL SYSTEM

[75] Inventors: Abdelgawad Abdelgawad, San Dimas; Mun Seog Choi, North Hollywood; Keith E. Lindsey, La Canada; Steven D. Scholfield, Glendora, all of Calif.

[73] Assignee: Lindsey Manufacturing Company, Azusa, Calif.

[21] Appl. No.: 482,673

[22] Filed: Jun. 7, 1995

Related U.S. Application Data

[62] Division of Ser. No. 55,078, Apr. 29, 1993, abandoned.

[51] Int. Cl.⁶ ................................................. H01F 41/00
[52] U.S. Cl. ........................ 29/602.1; 264/254; 264/255; 264/272.19
[58] Field of Search ................. 29/602.1; 174/150; 335/20; 200/144 B, 144 AP, 293; 264/272.19, 254, 255; 218/134–139, 118, 121, 155

[56] References Cited

U.S. PATENT DOCUMENTS

| | | | |
|---|---|---|---|
| 3,628,092 | 12/1971 | Keto | 317/15 |
| 3,812,314 | 5/1974 | Nonken | 200/144 B |
| 4,037,187 | 7/1977 | Himi | 332/121 |
| 4,123,618 | 10/1978 | Cushing et al. | 174/11 BH |
| 4,124,790 | 11/1978 | Kumbera et al. | 200/144 B |
| 4,210,774 | 7/1980 | Perry | 174/140 |
| 4,241,373 | 12/1980 | Mara et al. | 361/91 |
| 4,537,803 | 8/1985 | Dakin et al. | 427/385.5 |
| 4,568,804 | 2/1986 | Luehring | 200/144 B |
| 4,615,741 | 10/1986 | Kobayashi et al. | 106/308 M |
| 4,950,979 | 8/1990 | Stegmuller et al. | 324/126 |
| 5,351,388 | 10/1994 | VanDen Berg et al. | 29/602.1 |

OTHER PUBLICATIONS

Electrical Power Research Institute report entitled "Development of Polysil Material for Electrical Applications", prepared by Lindsey Industries, Inc., May 1979.

A.B. Chance Co., Centralia, Missouri brochure entitled "Single–Phase Encapsulated Loadbreak Vacuum Switch", Jan. 1970.

Popeck, article entitled "The Development of an Encapsulated Loadbreak Vacuum Switch for Underground Distribution Sectionalizing", undated, A.B. Chance pp. 3–5.

Odom et al. paper entitled "Development and Testing of Encapsulated Vacuum Sectionalizing Switch for Underground Distribution", pp. 191–197, ITT Spec. Tech. Conf. on Underground Distribution, Anaheim CA, Nay 12–16, 1969.

*Primary Examiner*—Carl E. Hall
*Attorney, Agent, or Firm*—Christie, Parker & Hale, LLP

[57] ABSTRACT

An integrated electrical system includes a first conductor for receiving current from power lines or other equipment. The conductor is coupled to a conventional vacuum switch for controlling flow of current through the system. A current collector coupled to the vacuum switch collects current from the vacuum switch. A second conductor coupled to the current collector delivers current to equipment or lines externally of the device. The components of the system are housed within an inner epoxy encapsulated within Polysil. The epoxy preferably has temperature characteristics which are similar to that of Polysil to prevent cracking due to temperature stress. At least one sensor may also be provided integrally with the components for detecting faults or for sensing general power line conditions. A preferred voltage sensor has resistive shielding for accurate sensing in adverse environments.

7 Claims, 8 Drawing Sheets

PRIOR ART-SECTIONALIZER

THERMAL EXPANSION GRADIENT
POLYSIL AND VARIOUS FILLED EPOXIES

METHOD OF MAKING AN INTEGRATED ELECTRICAL SYSTEM

CROSS-REFERENCE TO RELATED APPLICATION

This is a division of application Ser. No. 08/055,078 filed Apr. 29, 1993, now abandoned.

FIELD OF THE INVENTION

This invention relates to power distribution networks and, more particularly, to an integrated high-voltage electrical system for switching power and sensing conditions within power lines.

BACKGROUND OF THE INVENTION

It is well known to use electric switching devices for controlling the application of power in power distribution networks. Reclosing and sectionalizing high-voltage switches are commonly used to isolate portions of power distribution networks for the purpose of correcting fault conditions and rechanneling power through working lines.

Such switches must often cut high voltage between two relatively closely spaced points. Arcing can occur between terminals within a switch or outside of the switch. Vacuum switches are commonly used to achieve high-voltage switching and prevent arcing within the switch. These vacuum switches insulate high voltage on one terminal from ground on a second spaced-apart terminal by utilizing a vacuum. However, because detrimental electric arcing can also occur around the typically porcelain encasing of the vacuum switch, the vacuum switch must be properly insulated.

Many elaborate schemes have been developed to ensure that destructive arcing does not occur around the vacuum switch. In one common application, the vacuum switch is immersed in oil, which is a good insulator. The oil is typically contained in a metal or dielectric material housing having suitable mechanical properties. In the prior art, the dielectric material is typically porcelain.

These prior art embodiments suffer from various disadvantages. For example, each of the prior art reclosing or sectionalizing switches is relatively bulky. The average size and weight of the prior art embodiments is approximately 1200 pounds for a conventional three phase system. If the devices explode for some reason, hot oil could splash on workers. If a leak occurs, the oil will be lost along with the insulation capabilities of the switch. In such a case, sparking may occur across the outer portions of the vacuum switch, rendering the entire device inoperable. In those devices formed of porcelain, the porcelain material is brittle and may become damaged during transit.

In addition to a system which eliminates some or all of the disadvantages described above, those skilled in the art would appreciate a system which provides high accuracy voltage sensing in a relatively compact system.

In many cases, high voltage components which require insulation may be used in outdoor environments involving drastic temperature swings. In such environments, one skilled in the art would appreciate a system which is operable over a wide temperature range and could withstand adverse environmental conditions without detrimental effect.

SUMMARY OF THE INVENTION

The present invention eliminates the disadvantages of the prior art switch devices by providing a relatively compact integrated electrical system for sectionalizing power distribution systems, and accurately sensing electrical conditions over a wide temperature range. The integrated electrical system includes a first electrode for receiving current from power lines or other equipment. The electrode is connected to one terminal of a conventional vacuum switch for controlling flow of current through the system. Another terminal of the vacuum switch is coupled to a second electrode for delivering current to equipment or lines externally of the device.

The components of the integrated electrical system are precast within an engineered epoxy having desirable electrical and mechanical properties. In a preferred form of the invention, the epoxy precast components are then encapsulated in a second type of organic resin insulation material which has good resistance to outdoor erosion. However, the second encapsulation can be omitted.

In another form of the invention, at least one sensor, such as a current sensor, or a voltage sensor, or both, is provided integrally with other components to provide sensing capability for fault detection or general sensing of power line conditions.

In an embodiment of the integrated electrical system having a voltage sensor, a high accuracy graded shield voltage sensor is provided. The graded shield voltage sensor includes a conventional voltage divider circuit having a primary input resistor. A plurality of serially connected shield resistors are shunted across the voltage sensor for grading high voltage across the voltage divider in the dielectric material surrounding the primary resistor.

By providing relatively constant voltage gradation, the voltage sensor is effectively shielded from changing environmental conditions external of the sensor which may limit the accuracy of the voltage sensor. Also, the graded shield voltage sensor can be made in a relatively compact encasing while providing high accuracy voltage data to external circuits or remote terminal units.

For reliable operation in adverse environments, there is also provided in practice of the present invention an engineered epoxy composition comprising epoxy and filler material which can be used either alone or with other insulating materials.

DESCRIPTION OF THE PRIOR ART

Figure 1:
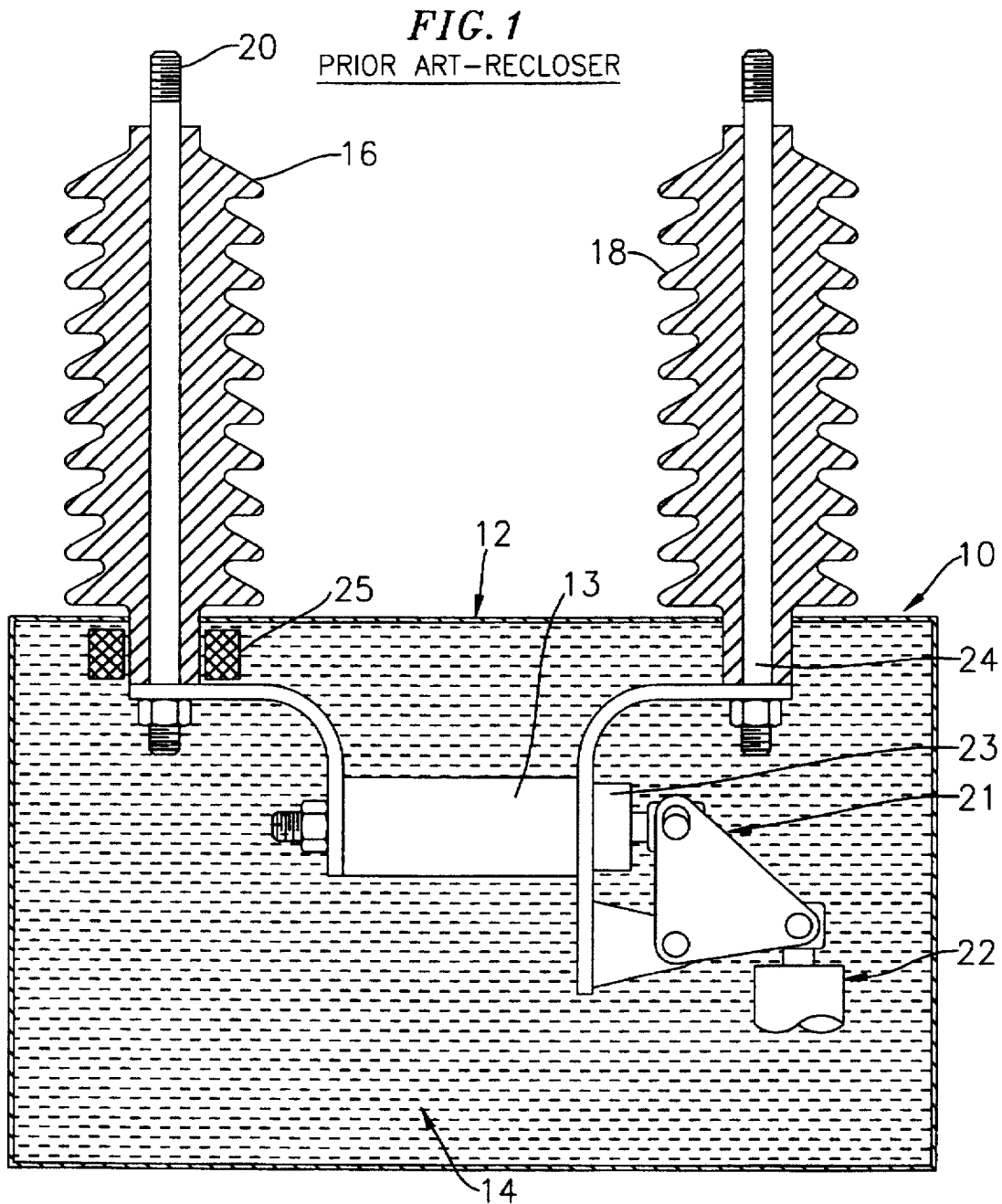
FIG. 1 is a side view, partly in cross section, of a prior art high-voltage switching device.

Existing high-voltage recloser and sectionalizer devices typically contain varying amounts of dielectric material surrounding an oil-immersed vacuum switch. A first prior art device 10, known in the art as a recloser, is shown in FIG. 1. Reclosers are typically used to identify a fault, and repeatedly open and close if a fault is detected to correct the fault. A prior art recloser includes a metal housing 12, which contains a conventional vacuum switch 13 immersed in oil 14. First and second apparatus bushings 16, 18, respectively, are used to get high voltages through the housing to and from the vacuum switch. The bushings allow high voltage to be passed through a ground plane, in this case, the metal housing.

In operation, high voltage applied to an electrode 20 within the first bushing passes to the vacuum switch connected to the electrode. An operating switch 21 and rod assembly 22 opens and closes switching terminals (not shown) within the vacuum switch. The vacuum switch is also connected to a current collector 23 for collecting current from the vacuum switch and delivering the current to an electrode 24 in the second bushing. A transformer 25 for sensing current within the device is coaxially mounted around the electrode 20 of the first bushing. In practice, the current sensor is used in conjunction with the recloser to detect faults.

The recloser of FIG. 1 uses a relatively large amount of oil. The overall weight of the device is nearly 1200 lbs. for a three phase system due to the metal encasing and six apparatus bushings which must be used outside of the device. Moreover, this embodiment, as shown, does not sense voltage conditions.

Figure 2:
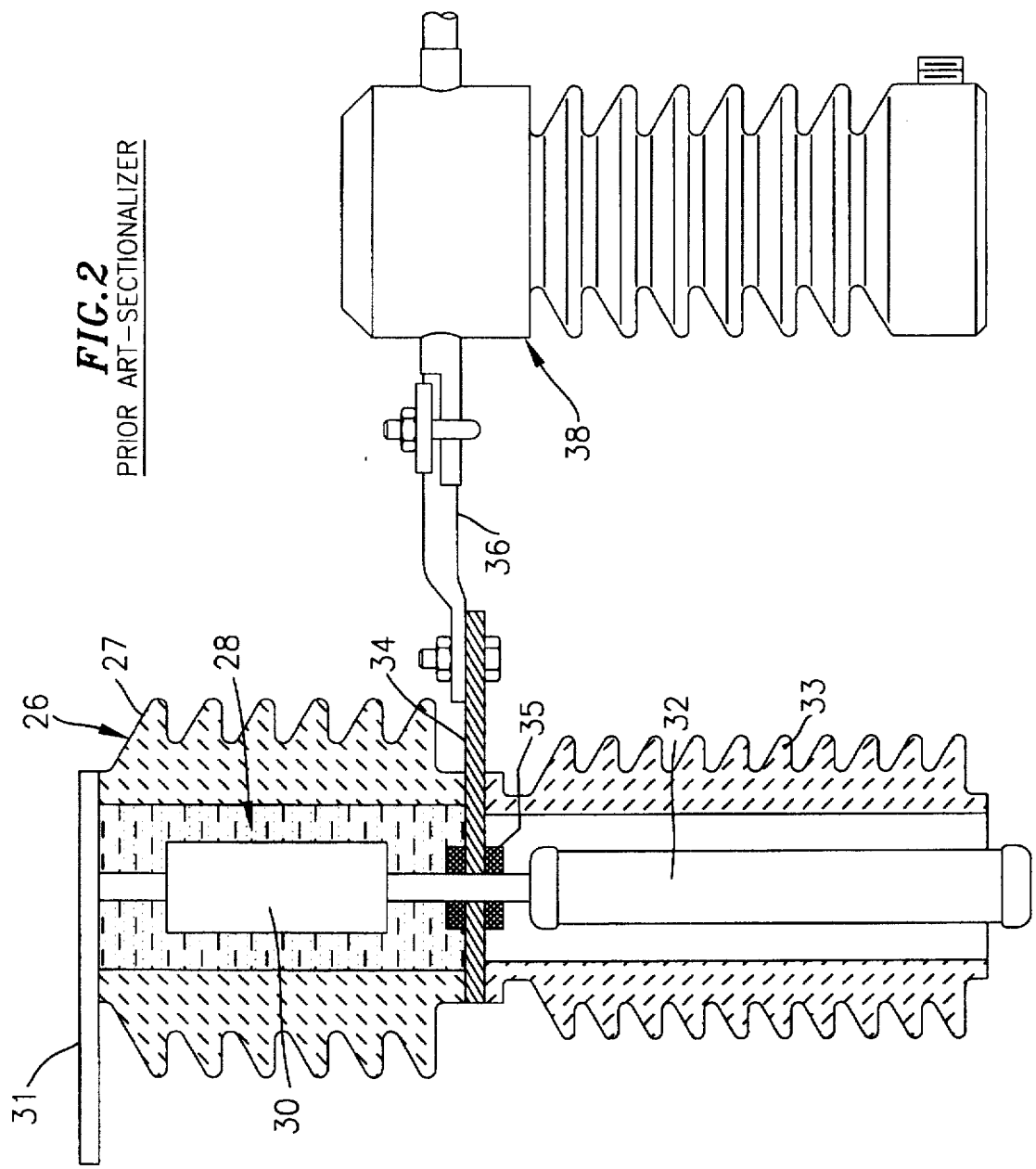
FIG. 2 is a side view, partly in cross section, of another prior art high-voltage switching device.

A second prior art high-voltage switching device 26, commonly known as a sectionalizer is shown in FIG. 2. Sectionalizers are typically used to isolate faults in a power distribution network. One type of sectionalizer has a brittle porcelain outer casing 27 for containing oil 28. A vacuum switch 30 is connected at one end to a top electrode 31 and at its opposite end to an insulated operating rod 32 for moving internal plates (not shown) of the vacuum switch. The operating rod is encased in a standoff insulator 33 to prevent arcing between a side electrode 34 and components connected to the switch. The vacuum switch is coupled to a conventional current collector 35 which collects current from the vacuum switch and delivers the current to the side electrode. A cable 36 connects the side electrode to an external monitoring insulator 38 which encloses conventional sensing circuitry (not shown) to sense current and voltage conditions of a power line proximate the device.

Sectionalizer devices are commonly used to isolate a portion of a power distribution network when no voltage or current is present near the device. Therefore, in practice, sectionalizers typically require some sort of voltage or current sensing device to properly operate.

DETAILED DESCRIPTION OF THE INVENTION

Figure 3:
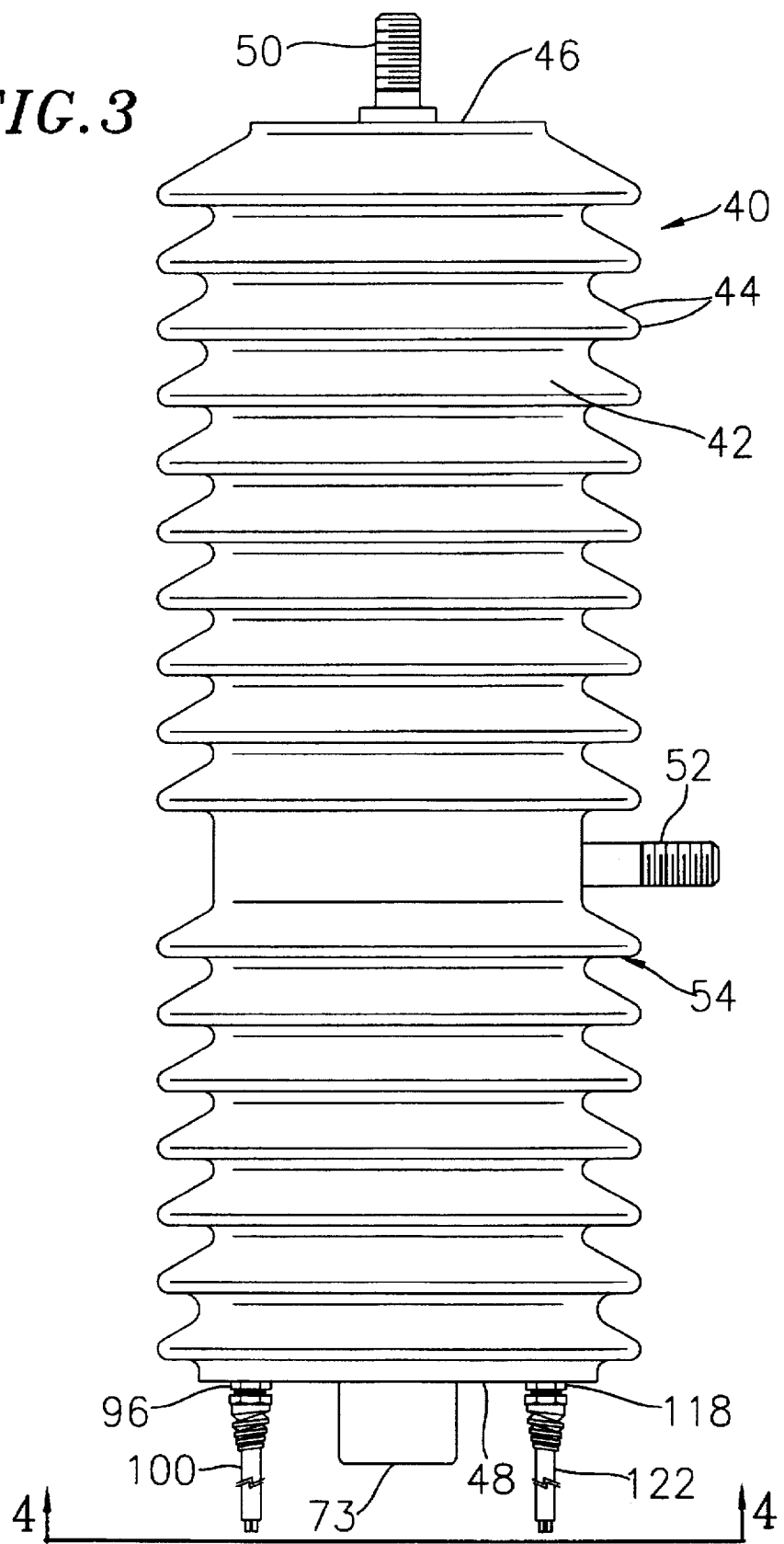
FIG. 3 is an elevational side view of a preferred embodiment of an integrated electrical system according to the present invention.

Referring to FIG. 3, an integrated high-voltage electrical system 40 according to the present invention, which may be used as either a sectionalizer or a recloser, includes an insulating outer body 42 having limited electrical conductivity. The insulating outer body is made of highly filled epoxy, polyester resin, or other suitable insulator material, preferably, Polysil (a trademark of the Electric Power Research Institute for a casting material which is a mixture of inorganic fillers such as silica, and an organic resin such as a polyester or methylmethacrylate). The insulating body has an essentially cylindrical shape with corrugated exterior sidewalls 44 and essentially flat upper and lower base portions 46, 48, respectively. An external threaded upper electrode 50 protrudes outwardly from the upper base portion, and an external threaded side electrode 52 protrudes outwardly from the sidewall near the mid-section 54 of the insulating body. The threading and diameter of the electrodes preferably corresponds to industry standards for equipment interface. In practice, ends of a high-voltage power line (not shown) are coupled to the electrodes to allow current to pass through the system.

The overall weight of the integrated electrical system is about 600 lbs. for a conventional three-phase system, including three separate insulated electrical systems, operating mechanisms (not shown), and control circuits (not shown), which makes it easy to handle and place at various points in a power distribution network (not shown). The Polysil encapsulant for the system has desirable electrical and mechanical properties and has a relatively light weight compared to metal encasing. Moreover, the Polysil is not brittle like porcelain and, therefore, the Polysil resists breakage better than porcelain.

Figure 4:
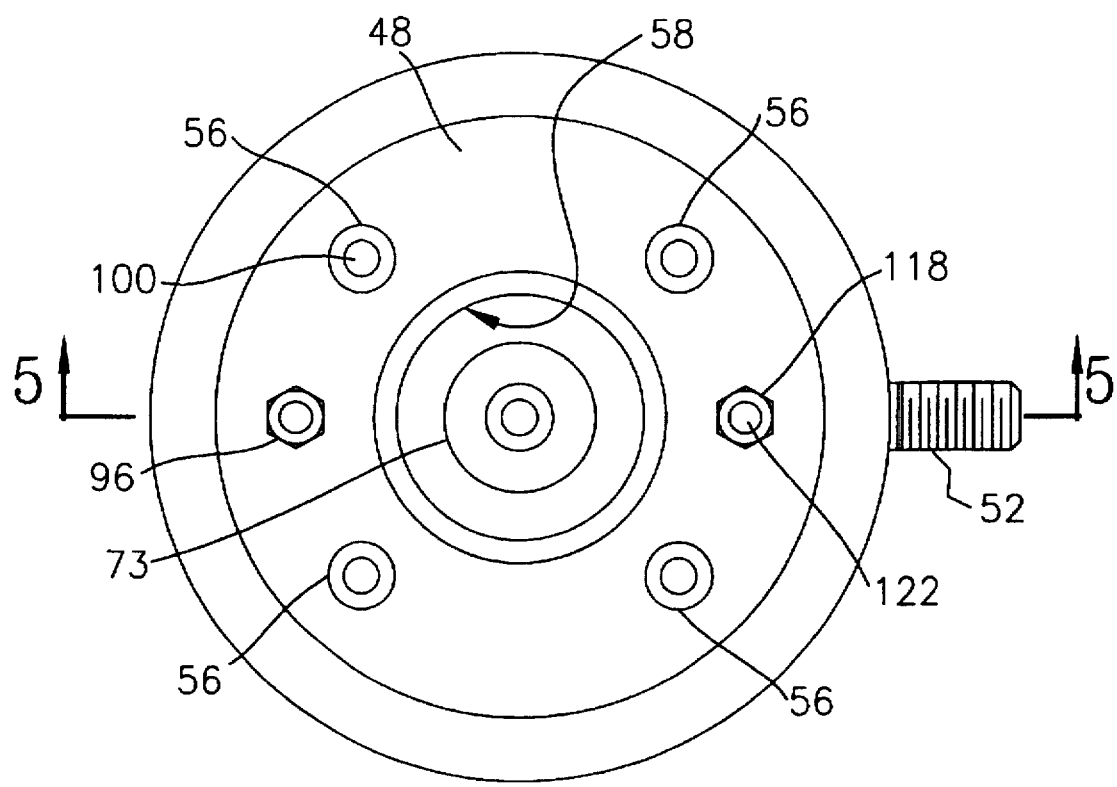
FIG. 4 is a view taken on line 4—4 of FIG. 3.

Referring to FIG. 4, the lower base portion 48 of the insulating body includes four substantially identical threaded inserts 56 equally spaced apart at substantially equal radial lengths from the center of the lower base portion. The threaded inserts are of standard design for coupling with other high-voltage electrical parts. The configuration is preferably a four-threaded insert on a five-inch bolt circle. A downwardly and outwardly sloping pull-rod cavity 58 extends from the center of the system to open out the bottom of the lower base portion.

Figure 5:
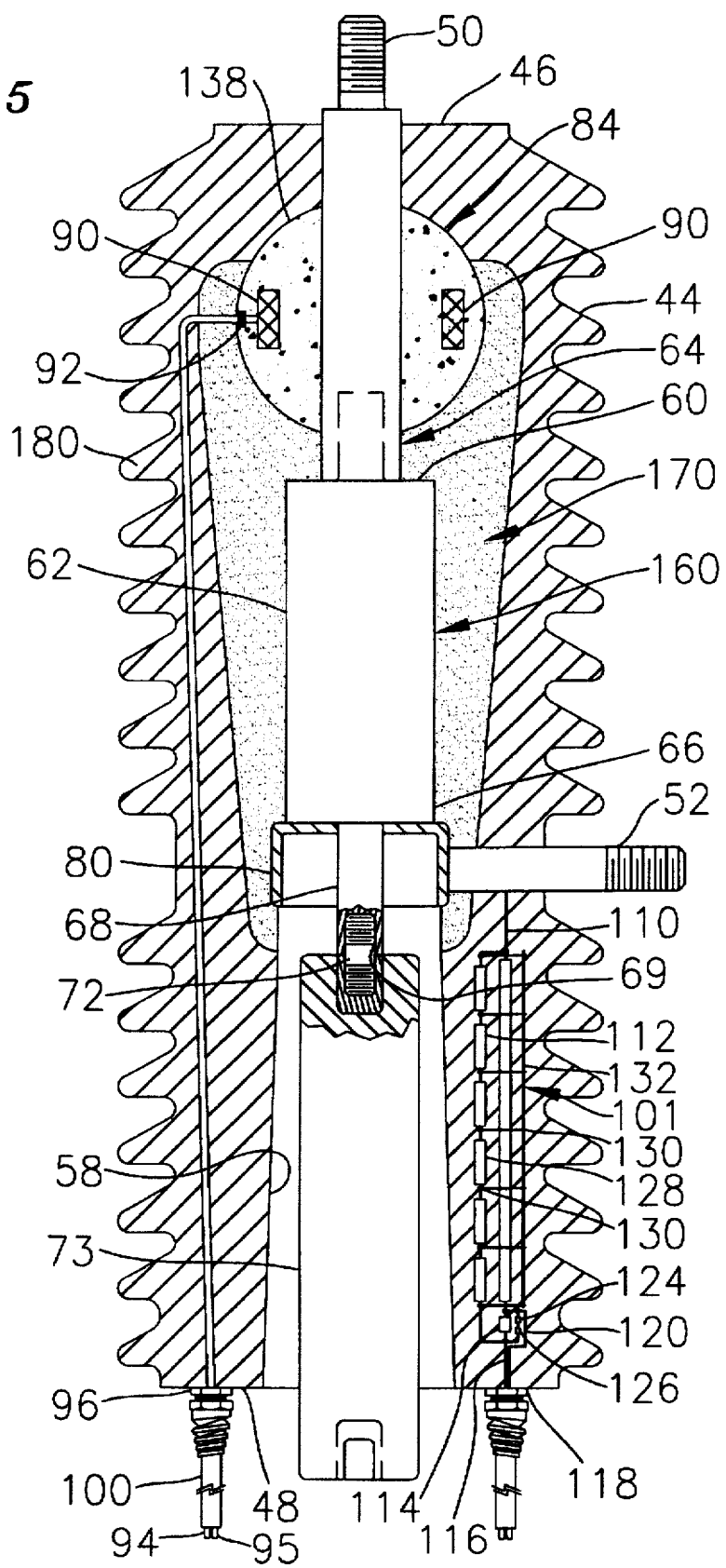
FIG. 5 is a view, partly in cross section, taken on line 5—5 of FIG. 4.

Referring to FIG. 5, there is shown a partial cross section of a preferred embodiment of the present invention. The lower end of the upper electrode 50 is coupled to an upper end 60 of a conventional vacuum switch 62. The vacuum switch includes a pair of metal plates (not shown), one stationary and one movable, within a vacuum tube. In the "on" position, the plates contact each other, allowing current to flow through the switch. The switch is turned "off" by pulling the movable plate away from the stationary plate, thus creating a void within the vacuum tube between the plates. Because the tube is in vacuum, an electric arc cannot readily form between the spaced-apart plates, and current flow is effectively blocked.

The lower end 66 of the vacuum switch includes a conductive and downwardly extending threaded vacuum switch lead 68 coupled to the movable plate within the switch. A downwardly opening and internally threaded bore 69 receives the upper end of a conventional threaded connecting stud 72, the lower end of which is threaded into the upper end of a conventional pull-rod 73. The pull-rod is made from any suitable insulating material, such as porcelain or Polysil. The pull-rod is mechanically operable by any suitable means, such as a conventional cam-operated mechanism (not shown), to linearly control the vacuum switch movable plate, thereby turning the switch on and off.

A downwardly opening conventional cup-shaped current collector 80 is lodged between the lower end of the vacuum switch and is coupled to the inner end of the stationary side electrode 52. The current collector is mechanically connected to the vacuum switch through a pair of conventional stud bolts (not shown). Current may be transferred from the vacuum switch to the current collector in a number of ways, including, for example, through conductive rollers or flexible cables (not shown). The current collector is preferably formed of metal or other highly conductive material to channel the current to the side electrode. Current does not flow to the pull-rod because it is insulated. Current from the current collector is transferred to the side electrode. The outer end of the side electrode is preferably of conventional configuration to allow coupling of the integrated electrical system with standard high-voltage electrical equipment.

The integrated electrical system does not require any oil for insulating the vacuum switch. This eliminates oil leaks and prevents potential danger to workers resulting from hot oil splash. The solid insulating material used to encapsulate the device is not brittle like porcelain and can be readily transported without worry of damage.

The preferred embodiment of the integrated electrical system contains a current sensor 84 and a voltage sensor 101 integrally formed within the insulating body to produce signals indicating the electrical conditions within the system. A current sensor is essential in a recloser; a voltage or current sensor is essential in a sectionalizer. However, by having both current and voltage sensing in an integrated device, the combined current and voltage data may be used for general sensing of power line conditions. This data can be channeled to remote terminal units for operating a complex distribution network. In the distribution network, the data may be used to determine whether new lines or new subdivisions are required, for example.

A current sensor 84, which may be conventional, is preferably coaxially mounted around the upper electrode near the upper end of the vacuum switch. The current sensor includes a current-sensing circuit comprising a current transformer 90. Furthermore, a current output resistor 92 may be used in some applications. Preferably, the transformer is a standard, toroidally-wound transformer with either a 600:1 or 600:5 winding ratio. The current signal output of the transformer may be shunted across the appropriately-sized output resistor 92 to produce a low-voltage analog current output signal. A pair of current sensor leads 94 and 95 connected across the current output resistor carry the current output signal and extend through current data output connector 96 mounted on the lower base portion of the insulating body. Current passes from the insulator to an output cable 100, preferably having built-in conventional strain relief (not shown), and then to a remote terminal unit (RTU) (not shown). If the integrated electrical system is used as a recloser, then the output signal is delivered to an electronic control circuit (not shown) for repeatedly operating and closing the switch when a fault is detected.

In a preferred embodiment of the integrated electrical system, shown in FIG. 5, a graded shield voltage-sensing circuit 101 is contained within the insulating body near the side electrode 52 and adjacent the pull-rod cavity 58. The voltage-sensing circuit includes a conventional three-ended voltage divider circuit having a tap lead 110, connected at one end to the side electrode 52 and at its other end to an input or primary resistor 112. An output or secondary resistor 114 is connected in series with the primary resistor and an output lead 116. The output lead is connected to a voltage data output connector 118, preferably having built-in conventional strain relief (not shown), mounted on the lower base portion of the insulating body. A divider lead 120 is connected between the primary resistor and secondary resistor to the voltage data output connector.

The input resistor has a high resistance (preferably between about 50 million Ω and about 200 million Ω) to produce a low-voltage output signal from the sensor. The output resistor has a much lower value, e.g., between about 10,000 Ω and about 50,000 Ω. The input and output resistors are preferably selected with matching temperature characteristics to ensure less than a 0.5% ratio change from about −55° C. to about 105° C. The output of the voltage sensor at the output and divider leads is a low-voltage, analog signal proportional to the voltage on the main line, with an accuracy of ±1% over a wide range of operating conditions. The circuit also provides voltage phase angle information within ±1.5° accuracy of the actual value in the line. Although this high level of accuracy is preferred, more or less accurate measurements may be obtained by using different components. Furthermore, although the apparatus described here is designed to provide raw data input to a switch circuit or an RTU, additional standard apparatus may be embedded within the sensing plug to process the signal before it is passed.

Back-to-back zener diodes 124, 126 shunted across the output resistor, provide a voltage-clipping circuit, which clips the voltage output at, say, 24 volts, if the secondary resistor 114 fails. This circuit provides safe voltage sensing because it prevents output voltage surges which may harm worker, damage external circuitry, or damage switching circuits or RTUs.

The graded shield voltage sensor described provides high-accuracy voltage sensing with relatively compact circuitry. However, variations in voltage data output from the sensor may be caused by capacitive coupling effects resulting from external changes around the insulator. These external changes commonly occur in outdoor switches subject to varying environmental conditions.

In an exemplary embodiment, the shield includes six substantially similar serially-connected shield resistors 128 shunted across the primary resistor. A separate shield loop 130 is connected between adjacent shield resistors. Each shield loop encircles the primary resistor, and lies in a plane substantially perpendicular to the primary resistor. Opposite the shield resistors, an insulating bar 132 may be used to hold the shield loops in place during casting of the insulating body.

The shield resistors and shield loops grade the electrical field from the high-voltage end of the sensor (at the input to the primary resistor) and the low-voltage end of the sensor (at the output of the secondary resistor). Assuming, for example, a nominal operating voltage of 15 KV, six shield resistors, and six shield loops, 15 KV would appear at the input to the primary resistor and at the first shield loop. Assuming each shield resistor has a value of 10 million Ω, only 12 KV would appear at the second loop, 9 KV at the third loop, and so forth. This relatively consistent gradation of the voltage across the shield resistors removes the electric field component normal to the primary resistor and shields the sensor from the capacitive coupling effects due to varying external influences and environmental changes. Because the shield voltage is graded, rather than at ground potential, electrical stress is reduced, and reduced insulating material between the primary resistor and shield resistors is required. Also, because the voltage gradient in the shield tracks the voltage drop across the primary resistor, capacitive coupling effects between the primary resistor and the shield are minimized.

The sum of the resistance values of the shield resistors, or the shield resistance, is approximately the same order of magnitude as the primary resistor. The lower limit of the shield resistance is controlled by power loss in the shield resistors. The power loss from the shield resistors should not exceed manufacturer's specifications for maximum voltage across the resistors. Thus, if the sum of the shield resistor values is an order of magnitude less than the resistance of the primary resistor, relatively more current would flow through the shield resistors to the primary resistor, effectively shortening the life of the resistors.

The upper limit on the shield resistance is determined by reduced shielding effect. If the resistance is too high, the shield resistors do not shield. Thus, if the sum of the shield resistor values is an order of magnitude greater than the resistance of the primary resistor, the voltage sensor may be susceptible to outside influences, which reduce its accuracy.

Although various quantities and values of shield resistors could possibly be used, the total length of the shield resistors, with allowance for the required electrical connections, preferably is approximately the same length as the primary resistor. In an exemplary embodiment, each shield resistor segment is about one inch in length, allowing for a shield loop diameter of about 2 inches. More shield resistors, and, therefore greater segmentation, enhances the shielding and minimizes the shield loop diameter, but the cost and availability of the resistors as well as manufacturing tolerance limitations should be considered. Conversely, too few shield resistors, with less segmentation, reduces the shielding effect and increases the required shield loop diameter due to greater voltage stresses. Finally, the shield resistors are preferably approximately equal in value per unit length, within a tolerance of about 10%, with the total shield resistance preferably about equal to the resistance of the primary resistor.

Figure 6:
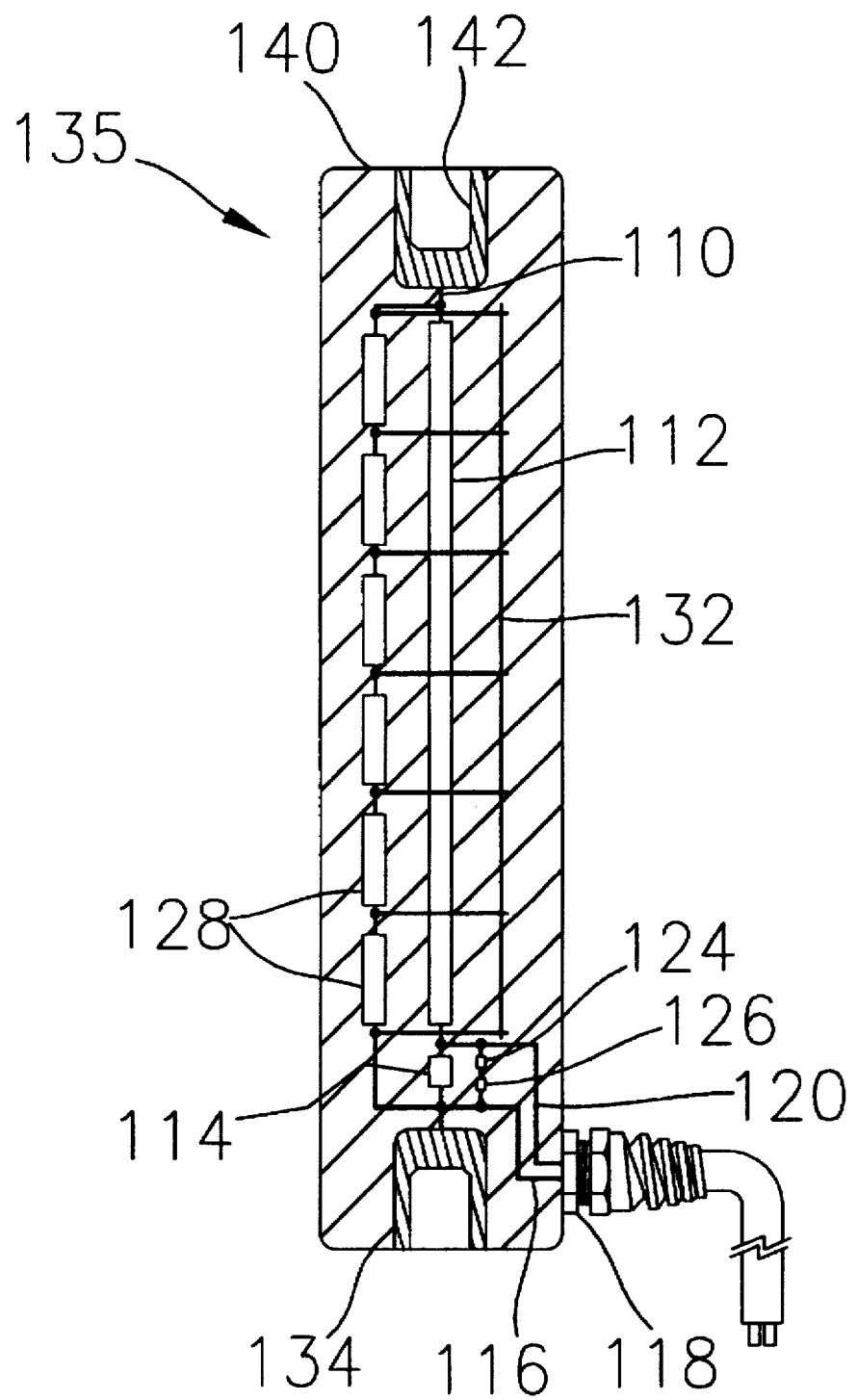
FIG. 6 is a cutaway view of a voltage-sensing vacuum switch pull-rod showing internal voltage sensing circuitry.

In another variation of the insulated electrical device, the graded shield voltage sensor is contained within a pull-rod 135, as shown in FIG. 6. The graded shield sensing pull-rod is interchangeable with the pull-rod 73 shown in FIG. 5. The voltage divider circuit in the sensor is essentially the same as that described above. For clarity, the same numbers are used for like parts in the two embodiments. In the pull-rod voltage sensor, the input lead to the input resistor is coupled to the coupling stud 72 (shown only in FIG. 5) at a high-voltage end 140 of the pull-rod via internal threading 142. The output connector 118 is preferably mounted on the side of the pull-rod near a low-voltage end 144 of the pull-rod to prevent interference with operating mechanisms coupled to the pull-rod, which can be made of any suitable casting resin, such as those disclosed herein.

Figure 6A:
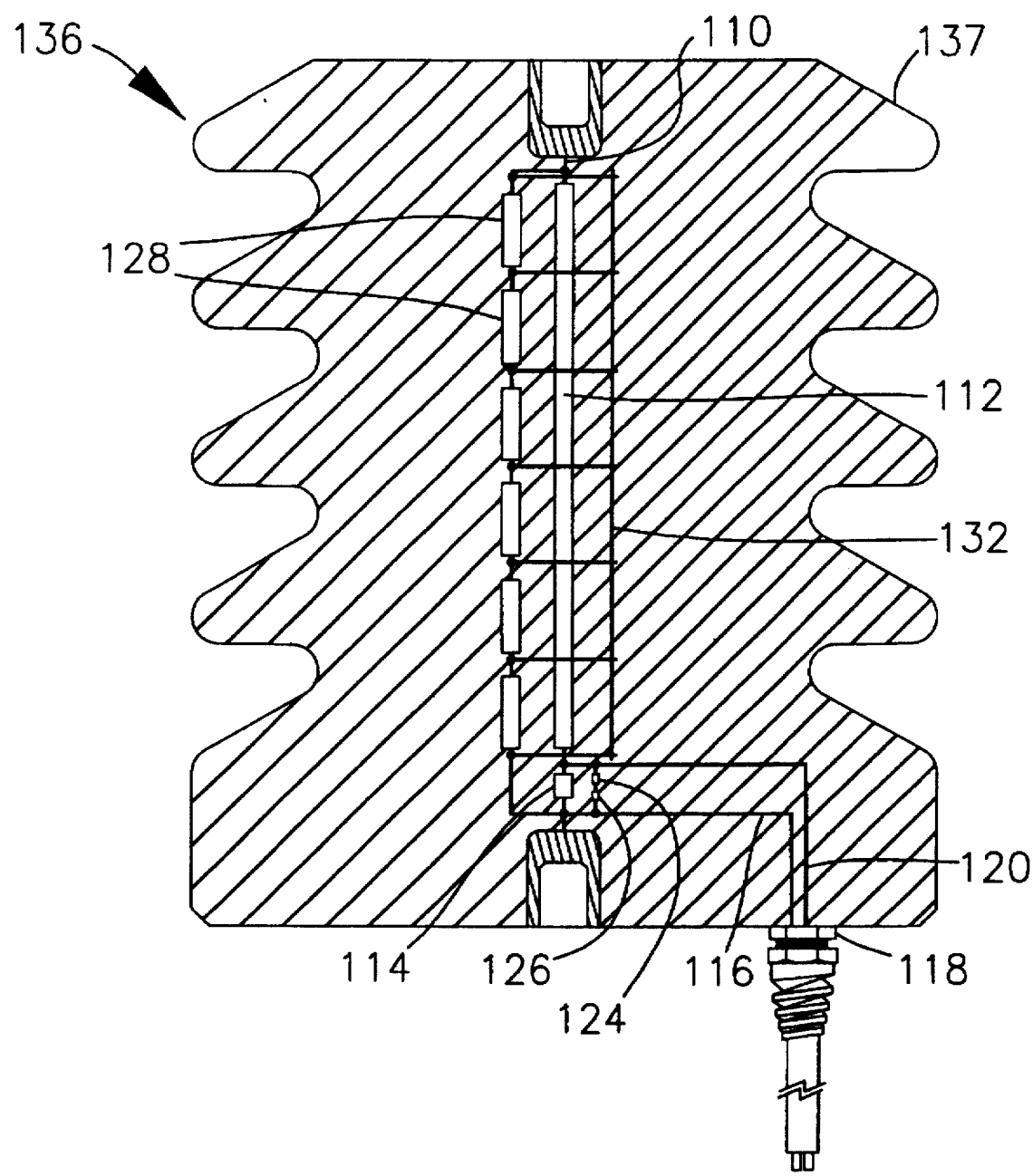
FIG. 6a is a cutaway view of a voltage-sensing standoff insulator showing internal voltage sensing circuitry.

Another embodiment of the graded shield voltage sensor is shown in FIG. 6a. The graded shield sensor of FIG. 6a is embedded in a conventional standoff insulator 136 having external shedding 137 for outdoor use. The sensing circuit is substantially similar to that shown in FIG. 6. For clarity, like numbers are used for like parts.

In practice, the graded shield voltage sensor may be used in conjunction with a broad variety of components in which accurate voltage sensing would be useful. For example, the sensor can be placed in the oil dielectric housed within the metal encasing of the prior art recloser of FIG. 1.

The sensing apparatus in the integrated electrical system provides numerous benefits not available in the prior art. First, the combination of both the current and voltage sensors as part of the integrated electrical system provides confirmation to remote sites whether the switch is open or closed. Current sensing alone is not a reliable indicator under circumstances where high voltage is present across the switch, i.e., power is on, but no current is flowing.

The sensing apparatus can also be used to provide a load check on the network.

The sensing apparatus can further be used to detect faults. For example, if high current is detected by the current sensor, this can indicate fault conditions. The reliability of fault detection depends on the number of sensors on the distribution network. With the present invention, numerous sensors can be conveniently placed at a variety of locations.

The graded shield voltage device is not limited for use in the integrated electrical system of this invention. The device can be used in any application which requires highly-accurate sensing of voltage conditions. Moreover, such a sensor can be housed in any suitable dielectric material such as, for example, polymer concrete, epoxy, sulfur hexafluoride ($SF_6$), oil, or a vacuum.

Referring again to FIG. 5, to assemble the preferred integrated electrical system of this invention, the current transformer 90 and the axial upper electrode 50 are preferably cast first in an initial epoxy casting 138 in a roughly spherical form. This is preferable because unacceptable voids may form when the current transformer windings are cast within the epoxy. The epoxy casting material is preferably specially engineered as described below. With the initial casting, the current transformer sensing capability can be tested independently before the sensor is integrated into the insulating body. The insulating capability of the current sensor can also be verified at this time to ensure that the insulation meets required specifications.

The initially cast transformer and upper electrode are then assembled in a mold (not shown) with the vacuum switch 62, the current collector 80, and the side electrode 52 to form an internal subassembly 160. This internal subassembly is cast in a second casting 170 having an inverted frustoconical form, and made using a special engineered epoxy casting described below.

In the integrated electrical system embodiment with the voltage sensor 101 embedded in the insulating body, the voltage-sensing circuitry is connected to the cast subassembly in a mold (not shown). The exposed portions of the current sensor leads are then appropriately placed in the mold. Then, a final encapsulant 180 is cast over the entire body to form the solid insulating body and to complete the integrated system in the form shown in FIG. 5.

The walls of the pull-rod cavity 58 in the encapsulant are preferably drafted to diverge downwardly to facilitate easy release from the cavity-forming mold. The size of the cavity is readily tailored to the specific type of pull-rod used by a particular customer.

To complete the assembly, the output connectors for the current and voltage sensors are attached externally of the insulating body.

To manufacture the integrated electrical system embodiment with the graded shield voltage sensor embedded in the pull-rod or the stand-off insulator (shown in FIGS. 6 and 6a), the same steps are used, except that voltage-sensing circuitry is assembled and placed within an appropriate mold for the pull-rod or stand-off insulator using conventional techniques.

The integrated electrical system preferably has electrical and mechanical characteristics that allow the system to be used for accurate sensing and switching in outdoor environments over a wide temperature range, say, between −40° C. and +60° C. The system has sufficiently high dielectric strength over that temperature range to insulate the high-voltage vacuum switch and to prevent destructive arcing around the switch. The system also passes corona tests used to determined whether voids are present within the insulator.

The preferred final encapsulant 180 is Polysil, a highly filled polymer concrete. Polysil is a registered trademark of The Electric Power Research Institute (EPRI). The formula for Polysil is disclosed on U.S. Pat. No. 4,210,774, issued to EPRI, the contents of which are incorporated herein by reference. Polysil has excellent electrical and mechanical properties. Its thermal coefficient of expansion matches that of the copper conductor within close dimensional tolerances in the temperature range from −40° C. to approximately +60° C.

We have found, however, that embedding the various components directly into the Polysil does not always provide satisfactory electrical results, primarily due to the shrinkage of Polysil. The engineered epoxy of the present invention allows components with complicated shapes and made of different materials (such as the vacuum switch, which is a porcelain cylinder capped at each end by metal closures) to be precast in the first 138 and second (if used) casting 170, and thus be made suitable for the final casting in Polysil. The engineered epoxy does not have the shrinkage problems associated with Polysil.

The system of this invention avoids cracking between the components and the engineered epoxy, and between engineered epoxy/Polysil interface because the coefficient of thermal expansion of the engineered epoxy closely matches that of the components, and tracks that of Polysil closely enough so that the entire casting maintains its integrity over a wide temperature range, i.e., more than a 100° C. temperature change. Thus, the entire system can withstand thermal shock for environments having temperatures which vary quickly over a wide range.

Figure 7:
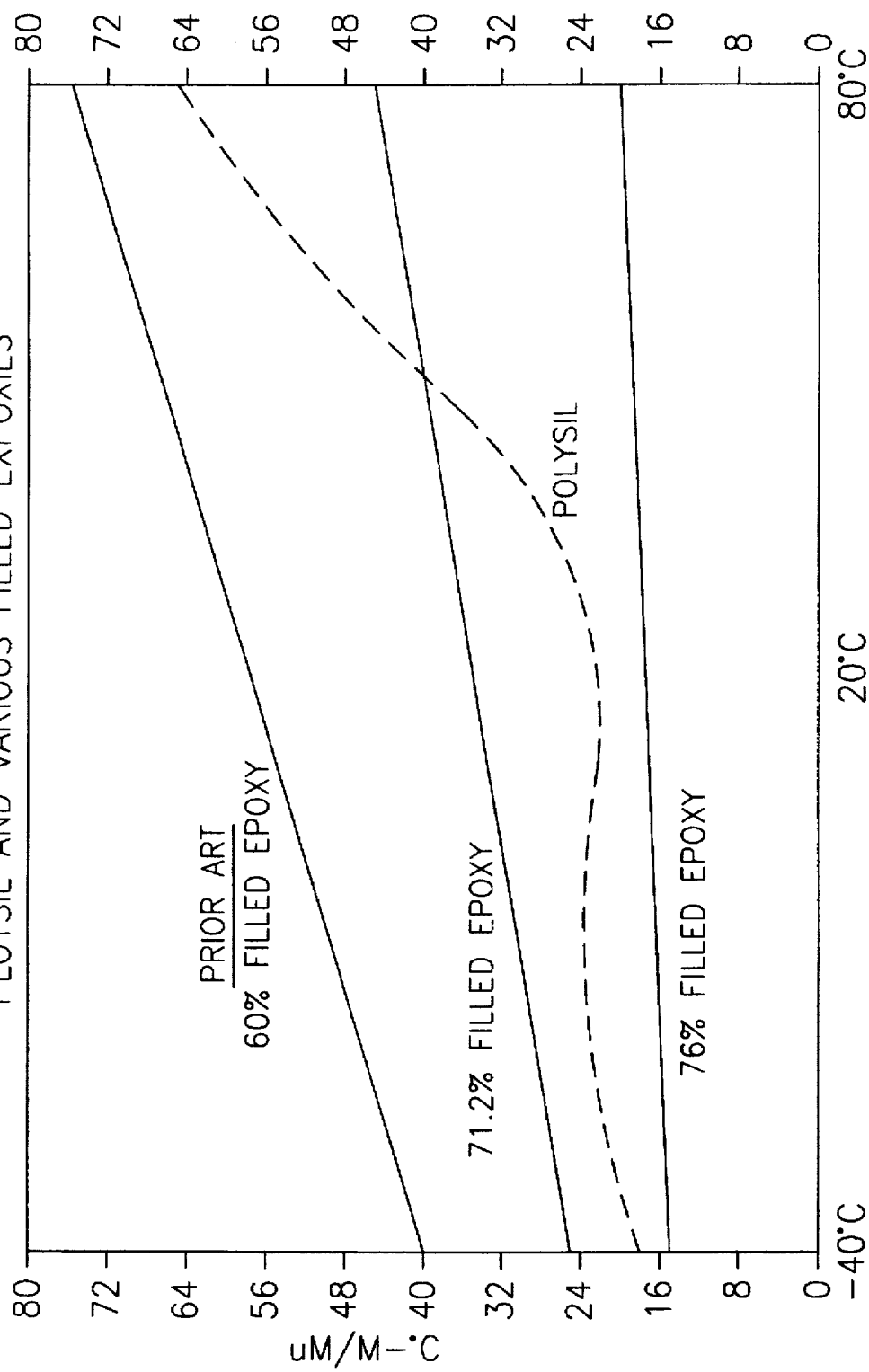
FIG. 7 is a graph of the thermal expansion gradients of various examples of engineered epoxy of the present invention.

The coefficient of thermal expansion of a prior art engineered epoxy having 60% filler by weight is shown in the graph of FIG. 7 along with the coefficient of thermal expansion of Polysil. We have found through extensive testing that the coefficient of thermal expansion of the 60% mix does not track that of Polysil well. We also have found that due to these dissimilar thermal characteristics, under extreme temperature conditions, unacceptable cracks may form at the epoxy/Polysil interface. We have further discovered that the characteristics of the engineered epoxy could be altered by, among other things, increasing the amount of filler by weight in the completed epoxy composition.

The engineered epoxy of this invention has a high dielectric strength, good corona properties, and thermal coefficient of expansion characteristics to provide a mechanically sound integrated electrical system.

The engineered epoxy is used for embedding composite devices such as current transformers, switches, voltage sensors, or other circuit components, for example, in Polysil over a wide temperature range from −40° C. to +60° C.

An exemplary engineered epoxy with a batch weight of 1159.3 grams is prepared by combining organic liquid ingredients and inorganic filler ground silica. The organic ingredients are combined as follows:

| ORGANIC INGREDIENTS | PREFERRED WEIGHT | PERMISSIBLE RANGE (% by weight) |
| --- | --- | --- |
| cycloaliphatic epoxy resin | 140 g | 41.6–42.2% |
| solid acid anhydride | 123 g | 36.5–37.1% |
| polyalkylene oxide polyol | 66 g | 19–21% |
| organosilane ester | 5 g | 0.5–2% |
| acrylate copolymer | 2 drops | 1–5 drops |
| chlorine base | 0.3 g | 0.05–0.15% |
| TOTAL LIQUIDS | 334.3 g | |

The preferred epoxy resin comprises 3,4-epoxycyclohexylmethyl-3,4-epoxycyclohexane carboxylate. This is a cycloaliphatic diepoxide used with anhydride curing agents. This resin provides good electrical and weathering properties with a high heat distortion temperature. The high heat distortion temperature is especially desirable in the integrated electrical system in which resistors carrying high voltage dissipate large amounts of heat. Such an epoxy resin is commercially available, for example, from Union Carbide, Inc. under the product name ERL 4221.

The preferred solid acid anhydride comprises hexahydrophthalic anhydride (HHPA) for curing the epoxy resin. This provides properties required for use in outdoor electrical applications. Such an acid anhydride is commercial available, for example, from Buffalo Color Corp.

A proper proportion by weight of curing agent to epoxide should be selected. Failure to select the correct proportion may result in unreacted or partially reacted material and a degradation of the resultant properties. The ratio (R1) is defined by $$R1 = \frac{\text{anhydride and/or acid groups}}{\text{epoxide groups}}$$

and is preferably equal to about 0.78.

The polyalkylene oxide polyol is a flexibilizer for the cycloaliphatic epoxy resin. This improves the mechanical properties of the engineered epoxy, including its toughness, heat distortion, and thermal shock resistance. It also improves the electrical properties, including the dielectric strength of the engineered epoxy. Such a polyol is available commercially from ARCO Chemical Company under the product names ARCOL LHT 28, ARCOL LHT 42, or ARCOL LHT 240. The difference between the three types of polyols is the hydroxyl number of the polyol.

The preferred total basic amount of polyol is 66 grams for the engineered epoxy composition. In a preferred embodiment, this amount includes 19 grams of LHT 28, 14 grams of LHT 42, and 33 grams of LHT 240. The range of polyol is approximately from 64 grams to 68 grams. The amount of polyol used in the engineered epoxy can vary within this range without significantly affecting the expansion properties of the engineered epoxy.

The organosilane ester, acrylate copolymer, and choline base are necessary but relatively less critical chemicals whose amounts can be varied without drastic effect.

The preferred organosilane ester comprises gamma-glycidoxyproyl trimethoxysilane. This is an adhesion promotor, or coupling agent, employed to enhance the bond strength between the filler and the epoxy resin. This is important to enhance the mechanical strength of the system. A suitable organosilane ester is available commercially from Union Carbide, Inc. under the product name Silane A-187.

The preferred amount of organosilane ester is 5 grams. The permissible range of the organosilane ester is from about 3 grams to about 5 grams. Increasing the amount beyond 5 grams provides no additional benefit.

The acrylate copolymer is a relatively insignificant chemical used to break down foam when vacuuming during casting of the epoxy system, as described below. This item is commercially available from Emerson and Cuming, Inc. under the product name Antifoam 88.

The choline base comprises (2-hydroxyethyl) trimethylammonium hydroxide and is used as a catalyst for curing the engineering epoxy. A suitable choline base is available, for example, from Rohm and Haas Co.

A total of 0.3 grams of a 45% methanolic solution of choline is preferable. The amount of choline base catalyst in the compound should be tightly controlled, although varying the amount would have only a minor effect on the characteristics of the compound.

The organic ingredients are combined with filler ground silica to produce an engineered epoxy according to the present invention as follows:

| FINAL MIX | PREFERRED WEIGHT | PERMISSIBLE RANGE (% by weight) |
|---|---|---|
| organic ingredients | 334.3 g | 27–32% |
| ground silica | 825 g | 68–73% |
| TOTAL MIX | 1159.3 g | |

The preferred filler is produced from high-purity microcrystalline silica, having a minimum of 99.65% silicon dioxide, precision ground to microcrystalline size. The silica is preferably such that 98% or more of the ground silica particles will pass a 106 micrometer screen. The average grain size of the silica particles is 7 microns. Such a filler is commercially available from U.S. Silica Company under the product name Sil-Co-Sil 106.

The percentage of filler is calculated by weight:

$$\% \text{ filler by weight} = \frac{\text{grams filler}}{\text{total weight of engineered epoxy}}$$

The percentage by weight of filler is critical in determining the coefficient of thermal expansion in the engineered epoxy. The preferred percentage for tracking the coefficient of thermal expansion for Polysil is about 71.2% by weight of the engineered epoxy, or 825 grams. For acceptable temperature characteristics, the usable range for the filler is between about 68% and about 73% by weight of the engineered epoxy.

The usable range of filler for the engineered epoxy is from about 68% to about 73%. The lower limit is controlled primarily by the thermal characteristics. The engineered epoxy does not track the coefficient of thermal expansion of Polysil suitably if the filler is less than about 68%. The upper limit is controlled by the manufactured ability of the material. Above about 73%, the material becomes unworkable and is not practical for low-cost integrated electrical system production.

To produce the engineered epoxy casting material, the preferred epoxy resin ERL 4221 is heated to 70° C. to lower its viscosity and facilitate mixing. The indicated amounts of LHT 28, LHT 42 and LHT 240 are mixed in, along with the Silane A-187 and the antifoam agent. The choline base is first mixed with the HHPA and then both are combined with the resin and mixed thoroughly. The Sil-Co-Sil is added slowly to the resin and mixed, taking care not to introduce air into the mixture.

To facilitate casting, the molds may be preheated to improve the flow characteristics of the engineered epoxy. The molds are filled under vibration and then evacuated to remove all entrapped air and ensure a void-free casting.

Once the molds are filled they are heated at 100° C. for 24 hours to cure the engineered epoxy.

After formation of the first and second epoxy castings, the Polysil encapsulant 180 is prepared and molded. Preferably, the exterior surface of the second casting of the engineered epoxy is sandblasted prior to embedding in Polysil, thereby exposing silica to provide a strong mechanical and chemical bond with the Polysil.

An exemplary Polysil composition with a batch weight of 48.5 lbs is prepared by combining organic ingredients and inorganic ingredients. The organic ingredients are first combined as follows:

| ORGANIC INGREDIENTS | PREFERRED WEIGHT | PERMISSIBLE RANGE (% by weight) |
|---|---|---|
| unsaturated polyester resin | 3230 g | 86–92% |
| styrene monomer | 250 g | 5–9% |
| wetting agents | 30 g | 0.4–1% |
| organosilane ester | 70 g | 0.5–2% |
| cobalt naphthenate | 2 g | 0.03–0.07% |
| methyl ethyl ketone peroxide | 46 g | 0.5–1.5% |
| 5% hydroquinone in N-butylphthalate | as required | 0–0.2% |
| TOTAL ORGANIC | 3628 g | |

For the organic materials, the polyester resin, when catalyzed, can be cured at room temperature. The resin provides strong cross-linking through double bonds with the styrene monomer. Such a resin has excellent mechanical properties and corrosion resistance for outdoor use.

A suitable polyester resin is available commercially under the product name Polylite 32-737 from Reichhold Chemicals, Inc.

The wetting agents reduce the surface tension of the unsaturated polyester resin facilitating the release of entrapped air. Suitable wetting agents are available commercially under the product names BYK A-501 and BYK A-515 from BYK Chemie U.S.A.

The organosilane ester is an adhesion promotor which enhances the bond strength between the polyester resin and filler material used in the final Polysil composition. Suitable organosilane ester is available commercially under the product name Silane A-174 from Union Carbide, Inc.

The methyl ethyl ketone peroxide is useful as a hardening agent. A suitable hardening agent is available commercially under the product name Lupersol-DDM-9 from Pennwalt Corporation, Lucidol Division.

The 5% hydroquinone in N-butylphthalate is used as an inhibitor to slow the speed of the chemical reaction as needed.

The inorganic ingredients are then combined as follows:

| INORGANIC INGREDIENTS | PREFERRED WEIGHT | PERMISSIBLE RANGE (% by weight) |
|---|---|---|
| whole grain sand | 26.2 lbs | 62–68% |
| ground silica | 9.0 lbs | 21–23% |
| alumina trihydrate | 4.5 lbs | 10.5–11.5% |
| titanium dioxide | 0.8 lbs | 1.5–2.5% |
| inorganic black pigment | 15 g | .05–.1% |
| TOTAL INORGANIC | 40.5 lbs | |

For the inorganic materials, suitable whole grain sand fillers of various gradations are available under the product names Flintshot 3.0, #17 Silica and F-70 silica from U.S. Silica Company.

The ground silica is preferably made of finely ground particles. Suitable ground silica is available commercially under the product names Sil-Co-Sil 106 and 15 micron Min-U-Sil from U.S. Silica Company.

The ground silica is preferably used in conjunction with the larger sand filler to fill in voids between the sand filler particles.

The alumina trihydrate is useful as an additional filler and reinforcing agent. Alumina trihydrate is available commercially from ALCOA.

Titanium dioxide is a pigment used in the Polysil composition. Suitable titanium dioxide is commercially available under the product name Titanox 2101 from NL Industries.

The inorganic black pigment is used to color the Polysil composition.

Finally, the organic and inorganic ingredients are combined as follows to produce a Polysil composition according to the present invention:

| FINAL MIX | PREFERRED WEIGHT | PERMISSIBLE RANGE (% by weight) |
|---|---|---|
| organic ingredients | 8 lbs | 15–17% |
| inorganic ingredients | 40.5 lbs | 83–85% |
| TOTAL MIX | 48.5 lbs | |

Another example of Polysil with a batch weight of 47.2 lbs. is also prepared by combining organic and inorganic ingredients. The organic ingredients are combined as follows:

| ORGANIC INGREDIENTS | PREFERRED WEIGHT | PERMISSIBLE RANGE (% by weight) |
|---|---|---|
| methylmethacrylate monomer | 2457 g | 80–85% |
| polymethylmethacrylate | 273 g | 8–10% |
| styrene monomer | 163 g | 3–7% |
| organosilane ester | 21 g | 0.5–2% |
| trimethylolpropane trimethylacrylate | 42 g | 1–2% |
| benzoyl peroxide | 41 g | 1.2–1.5% |
| N,N-dimethyl-P-toluidine | 21 g | 0.65–0.75% |
| TOTAL ORGANIC | 3018 g | |

For the organic materials, the methylmethacrylate monomer, when polymerized, provides excellent outdoor weathering characteristics due to its exceptional resistance to the effects of ultraviolet radiation. A suitable methylmethacrylate monomer is commercially available from Rohm & Haas Company.

The polymethylmethacrylate is a high molecular weight polymer in powder form, used to reduce the shrinkage of the cured system. A suitable polymethylmethacrylate is commercially available under the product name Acryloid A-11 from Rohm & Haas Company.

The styrene monomer improves the mechanical and electrical properties of the polysil formulation. A suitable styrene monomer is commercially available from Dow Chemical Company.

The benzoyl peroxide is the catalyst which initiates the chemical reaction at room temperature. A suitable benzoyl peroxide is commercially available under the product name Lucidol-98 from Pennwalt Corp., Lucidol Division.

The organosilane ester is useful as an adhesion promotor to enhance the bond strength between the filler sand and the methylmethacrylate in the Polysil composition. This is important to enhance the mechanical strength of the system. A suitable organosilane ester is commercially available from Union Carbide, Inc. under the product name Silane A-174.

Trimethylolpropane trimethylacrylate is a cross-linking agent that produces a network of cross-linked polymer chains giving strength, rigidity and thermal stability to the cured material. Trimethylolpropane trimethylacrylate is commercially available under the product name Sartomer 350 from the Sartomer Company.

Dimethyl-p-toluidine is an accelerator or promoter that increases the rate of polymerization at room temperature. Dimethyl-p-toluidine is commercially available from R.S.A. Corporation.

The inorganic materials are prepared the same as in the first Polysil embodiment. The inorganic materials are commercially available as disclosed above for the polyester resin embodiment of Polysil. The organic and inorganic ingredients are combined as follows to produce an alternate Polysil composition according to the present invention:

| FINAL MIX | PREFERRED WEIGHT | PERMISSIBLE RANGE (% by weight) |
|---|---|---|
| organic ingredients | 6.7 lbs | 13–15% |
| inorganic ingredients | 40.5 lbs | 85–87% |
| TOTAL MIX | 47.2 lbs | |

For a more detailed discussion of the formula for Polysil and a method for manufacturing Polysil, refer to U.S. Pat. No. 4,210,774, issued to EPRI, the contents of which have been incorporated herein by reference. For a more detailed discussion of the chemical composition and properties of various Polysil formulas, refer to EPRI Report EL-1093, Project 1203-1 Final Report, May 1979, entitled "Further Development of Polysil Material Systems for Electrical Applications", prepared on behalf of EPRI by Lindsey Industries, Inc. of Azusa, Calif., the contents of which are hereby incorporated by reference.

The thermal expansion characteristics of Polysil and various levels of engineered epoxy are shown in FIG. 7. Analysis of the thermal characteristics of Polysil in the −40° C. to +80° C. range shows a two-part curve. Below about 0° C., the gradient is in the 25 uM/M-°C. range. This value grows steadily from above 30° C. to about 60 uM/M-°C. at 80° C. The engineered epoxy of this invention exhibits a gradient similar to Polysil, but flatter. On the cold side, the epoxy exhibits a slightly greater expansion gradient, and on the hot side, the epoxy exhibits a slightly lower gradient. However, for the most part, the engineered epoxy approximates the coefficient of thermal expansion of Polysil.

In particular, the thermal expansion gradient exhibited by the engineered epoxy is between about 20 and about 30 micrometers per meter per °C. at about −40° C. and between about 38 and about 52 micrometers per meter per °C. at about 80° C.

The described embodiments of the invention illustrate the inventive concept. The scope of the invention is not restricted to such embodiments. Other arrangements may be devised by those skilled in the art without departing from the spirit and scope of the invention. For example, a number of different materials may be used within, or coated over, any high voltage component or completed embodiment of the invention. The engineered epoxy is useful for embedding composite devices such as switches, current transformers, voltage sensors, or other components in Polysil over a wide temperature range.

In moderate environments, the engineered epoxy may not be necessary. In such environments, Polysil or epoxy, or any other suitable insulating material may be used alone to provide adequate dielectric and mechanical properties for high voltage components.

Enhancements may be made to the current or voltage sensing circuitry to process the output before it is delivered to the RTU. In a given embodiment either the current or voltage sensors can be left out of the system entirely to meet customer requirements. The voltage sensor need not have graded shielding. Moreover, the invention may be formed in various sizes and with various dimensions necessary to accommodate different-sized connectors and internal components within the system, including specialized components provided by a customer.

We claim:

1. A method of assembling an integrated electrical system comprising the steps of:
   forming a first casting by molding a current transformer and an electrode axially traversing the current transformer within a mixture of epoxy resin and an inorganic filler;
   forming a subassembly by assembling the first casting to a vacuum switch, current collector, and output conductor; and
   forming a second epoxy casting by molding the subassembly within a mixture of epoxy resin and an inorganic filler.

2. The method of claim 1 further comprising the step of encapsulating the second casting within a third casting of an insulating material.

3. The method of claim 2 wherein the third casting comprises an insulating material the same as that of the first and second castings to produce an integrated electrical system.

4. The method of claim 2 wherein the third casting comprises an insulating material different from that of the first and second castings to produce an integrated electrical system.

5. The method of claim 1 wherein the step of encapsulating the second casting comprises encapsulating the second casting in a casting material made of a mixture of an inorganic filler and an organic resin selected from the group consisting of polyester resin and a methylmethacrylate resin.

6. The method according to claims 2 or 4 which includes electrically testing the current transformer after forming the first casting and before firming the second casting.

7. The method according to claims 2 or 4 which includes the step of abrading the surface of the second casting to expose an organic filler before encapsulating it in the third casting.

* * * * *

UNITED STATES PATENT AND TRADEMARK OFFICE
CERTIFICATE OF CORRECTION

PATENT NO. : 5,729,888
DATED : March 24, 1998
INVENTOR(S) : Abdelgawad Abdelgawad; Keith E. Lindsey; Steven D. Scholfield It is certified that error appears in the above-indentified patent and that said Letters Patent is hereby corrected as shown below:

On the title page, Item 75, Inventors, as a named inventor delete "Mun Seog Choi, North Hollywood;".

Signed and Sealed this

Ninth Day of February, 1999

Attest:

*Acting Commissioner of Patents and Trademarks*

Attesting Officer